(12) United States Patent
Maule et al.

(10) Patent No.: US 8,639,874 B2
(45) Date of Patent: Jan. 28, 2014

(54) POWER MANAGEMENT OF A SPARE DRAM ON A BUFFERED DIMM BY ISSUING A POWER ON/OFF COMMAND TO THE DRAM DEVICE

(75) Inventors: Warren Edward Maule, Cedar Park, TX (US); Kevin C. Gower, LaGrangeville, NY (US); Kyu-hyoun Kim, Mount Kisco, NY (US); Dustin James VanStee, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 1073 days.

(21) Appl. No.: 12/341,515

(22) Filed: Dec. 22, 2008

(65) Prior Publication Data

US 2010/0162020 A1 Jun. 24, 2010

(51) Int. Cl.
*G06F 12/06* (2006.01)
(52) U.S. Cl.
USPC .......................................................... 711/106
(58) Field of Classification Search
None
See application file for complete search history.

(56) References Cited

U.S. PATENT DOCUMENTS

| | | | |
|---|---|---|---|
| 4,658,379 A | 4/1987 | Fujishima et al. | |
| 5,513,135 A | 4/1996 | Dell et al. | |
| 6,134,681 A | 10/2000 | Akamatsu et al. | |
| 6,845,412 B1 * | 1/2005 | Boike et al. ..................... | 710/36 |
| 7,000,062 B2 | 2/2006 | Perego et al. | |
| 7,206,896 B2 | 4/2007 | Perego et al. | |
| 7,320,047 B2 | 1/2008 | Perego et al. | |
| 7,359,229 B2 | 4/2008 | Ferrant et al. | |
| 7,363,533 B2 | 4/2008 | Gower et al. | |
| 7,379,361 B2 | 5/2008 | Co et al. | |
| 7,380,179 B2 | 5/2008 | Gower et al. | |
| 7,403,409 B2 | 7/2008 | Dreps et al. | |
| 7,454,586 B2 * | 11/2008 | Shi et al. ....................... | 711/167 |
| 2003/0182588 A1 * | 9/2003 | Dodd et al. .................... | 713/300 |
| 2003/0213988 A1 | 11/2003 | Tsujino | |
| 2006/0236201 A1 | 10/2006 | Gower et al. | |
| 2008/0098165 A1 * | 4/2008 | Shinozaki et al. ............. | 711/103 |
| 2008/0270675 A1 * | 10/2008 | Nagaraj et al. ................ | 711/100 |

FOREIGN PATENT DOCUMENTS

WO      2008063251 A2      5/2008

OTHER PUBLICATIONS

Elpida 288M bits Direct Rambus™ DRAM, Feb. 2007.*

(Continued)

*Primary Examiner* — Matthew Bradley
*Assistant Examiner* — Ramon A Mercado
(74) *Attorney, Agent, or Firm* — Lynn L. Augspurger; Robert R. Williams (57) ABSTRACT

A computer memory, having one or more of a semiconductor memory device having an internal memory array comprising a plurality of semiconductor dynamic random access memory (DRAM) cells arranged in a matrix of rows and columns, and provided as a memory module rank of such memory devices arranged in an array on a DIMM of one or more of said semiconductor memory device on a substrate which can be coupled via a memory device data interface to a memory system as a memory subsystem, each of said memory device having a low power shut-down state that can be activated using a common memory data interface. Control of power to a DRAM issues over the data interface two commands to a DRAM power control command decode, a power-state program signal and a power-state reset signal as a power-state control commands to control the power state of said DRAM, and to activate for READ/WRITE a memory cell as a normal active or spare device.

1 Claim, 11 Drawing Sheets

(56) References Cited

OTHER PUBLICATIONS

V. Delaluz, M. Kandemir, N. Vijaykrishnan, A. Sivasubramaniam, and M. J. Irwin. 2001. DRAM Energy Management Using Sofware and Hardware Directed Power Mode Control. In Proceedings of the 7th International Symposium on High-Performance Computer Architecture (HPCA '01). IEEE Computer Society, Washington, DC, USA.*

Tektronix, Fundamentals of SDRAM Memory, Jun. 2005.*

Kingston, Memory ranks and Intel E7320 / E7520 chipset based servers, Apr. 2005.*

"System for Providing On-Die Termination of a Control Signal Bus", Kim et al., U.S. Appl. No. 12/112,391, filed Apr. 30, 2008.

* cited by examiner

FIG.3

| NORMAL MODE | READ/WRITE DATA | ACCESS COMMAND | MR |
| POWER-STATE PROGRAMMING MODE | POWER-STATE CODE | POWER-STATE CONTROL COMMAND | MRS |

POWER MANAGEMENT OF A SPARE DRAM ON A BUFFERED DIMM BY ISSUING A POWER ON/OFF COMMAND TO THE DRAM DEVICE

TRADEMARKS

IBM® is a registered trademark of International Business Machines Corporation, Armonk, N.Y., U.S.A. Other names used herein may be registered trademarks, trademarks or product names of International Business Machines Corporation or other companies.

BACKGROUND OF THE INVENTION

1. Field of the Invention

This invention relates to computer memory, and particularly to power management for DRAMs which allow issuing a power on/off command to a DRAM device on a DIMM.

2. Description of Background

Before our invention synchronous dynamic random access memory (SDRAMs or DRAMs) were employed on DIMMs or memory modules in computer systems and a standing spare memory cell or device was used to replace a failed memory cell or device. As an example, repairable fully-buffered memory modules have been used in personal computers which have spare or redundant repair memory that is accessed for repair addresses on the memory module. A repair controller has been used for accessing spare repair memory. These systems have not sufficiently considered the power consumption of handling redundant spare memory.

SUMMARY OF THE INVENTION

The shortcomings of the prior art are overcome and additional advantages are provided through the provision of a device and process for power management for DRAMs which allows issuing a power on/off command to a DRAM device on a DIMM.

The system described herein can employ an embedded program corresponding to aspects of the above-summarized methods which are also described and claimed herein, as well and the devices having this capability.

Additional features and advantages are realized through the techniques of the present invention. Other embodiments and aspects of the invention are described in detail herein and are considered a part of the claimed invention. For a better understanding of the invention with advantages and features, refer to the description and to the drawings.

TECHNICAL EFFECTS

As a result of the summarized invention, technically we have achieved a memory device with a self-timed refresh state that can be entered by a command issued across the memory device data interface to control the application of power in the system. The memory device is controlled with a power-off state where an individual device can be placed into a power-off state. A system can now have parts of the system selected to have a low power state that can be activated using a common memory interface.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

The detailed description explains the preferred embodiments of the invention, together with advantages and features, by way of example with reference to the drawings.

DETAILED DESCRIPTION OF THE INVENTION

Figure 1:
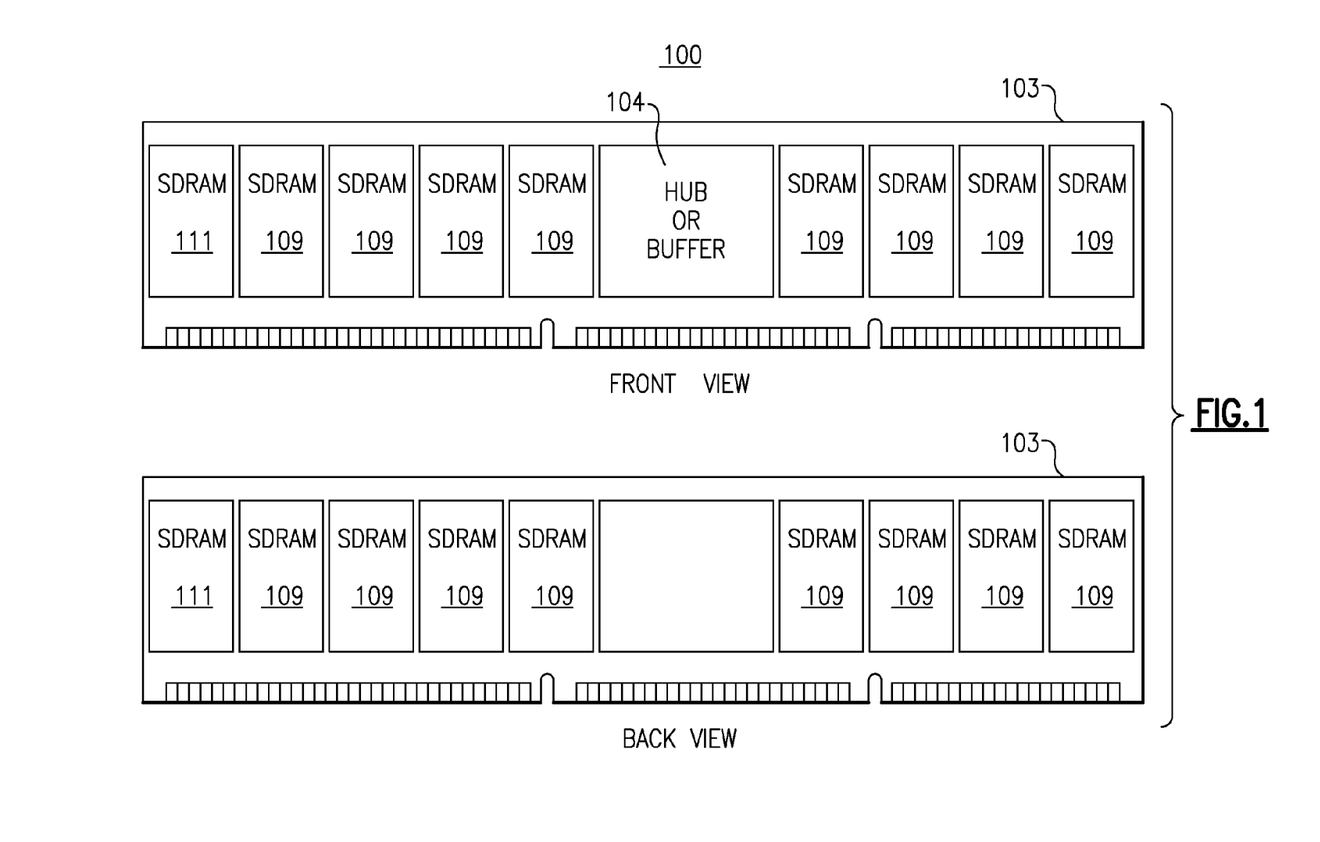
FIG. 1 illustrates the front and rear views of a memory sub-system in the form of a memory DIMM, which includes a local memory interface hub or buffer device interfacing with multiple memory devices, including spare memory devices, that may be implemented by exemplary embodiments.

Turning now to the drawings in greater detail, it will be seen that in FIG. 1 illustrates the front and rear views of a memory sub-system in the form of a memory DIMM, which includes a hub or buffer device interfacing with multiple memory devices, including spare memory devices. FIG. 1 (100), is an example of a Dual Inline Memory Module (heretofore described as a "DIMM") 103 shown which includes a local memory interface hub or buffer device (herein described as a "buffer" or "hub") 104, memory devices 109 and spare memory devices 111. The front and rear of the DIMM 103 is shown, with a single buffer device 104 shown on the front of the module. In alternate exemplary embodiments, two or more buffer devices 104 may be included on module 103 in addition to more or less memory devices 109 and 111—as determined by such system application requirements as the data width of the memory interface (as provided for by memory devices 109), the DIMM density (e.g. the number of memory "ranks" on the DIMM), the required performance of the memory (which may require additional buffers to reduce loading and permit higher transfer rates) and/or the relative cost and/or available space for these devices. In the exemplary embodiment, DIMM 103 includes eighteen 8 bit wide memory devices 109, comprising two ranks of 72 bits of data to buffer device 104, with each rank of memory being separately selectable. In addition, each memory rank includes a spare memory device (e.g. an 8 bit memory device) 111 which is connected to buffer 104 and can be used by buffer 104 to replace a failing memory device 109 in that rank. However, the number of memory devices on the memory module (e.g. the DIMM) will vary. Indeed, each individual memory device described herein has the provision of being a device applicable to the process for power management for DRAMs which allow issuing a power on/off command to a DRAM device on a DIMM. In accordance with our invention a memory device or DRAM or memory cell is a semiconductor memory device having an internal memory array comprising a plurality of semiconductor dynamic random access memory cells arranged in a matrix of rows and columns, and a memory module or DIMM is a rank or memory cell array of such memory devices arranged in an array of one or more memory devices on a substrate which can be coupled via an I/O interface to a memory system as a memory subsystem.

Figure 2:
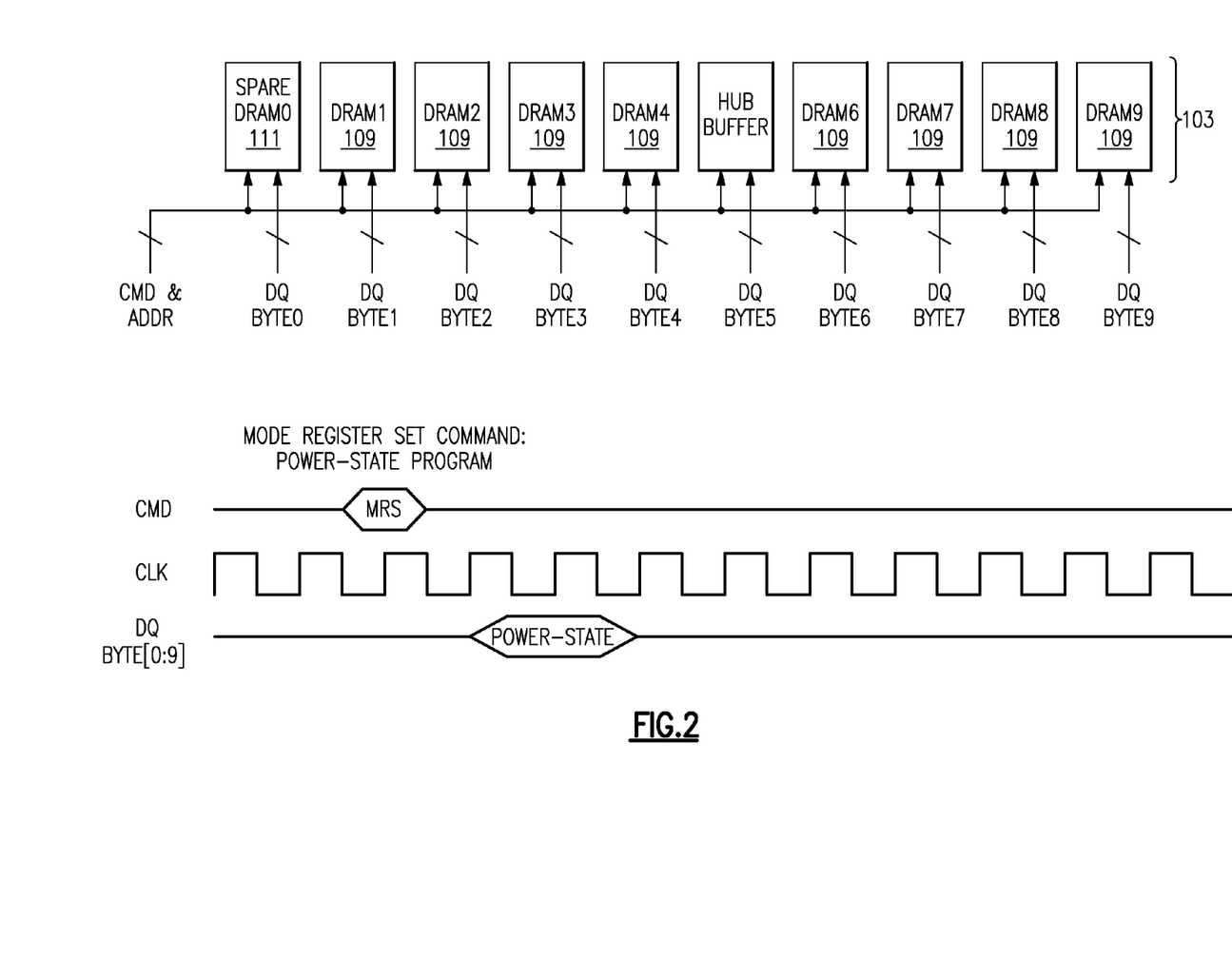
FIG. 2 illustrates (for one side view of the DIMM) the high frequency bus for the DIMM 103 memory cell array.
Figure 3:
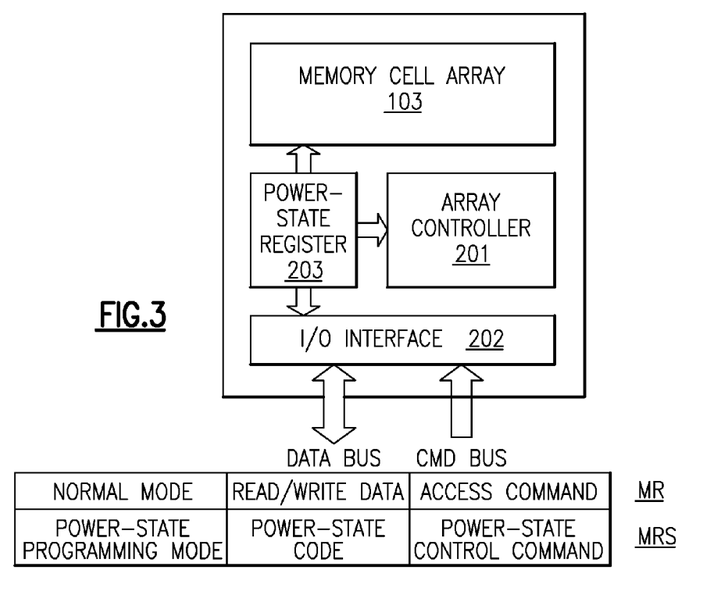
FIG. 3 illustrates the memory cell array which includes the local memory interface hub device 104 and memory device(s) 109.

FIG. 2 illustrates (for one side view of the DIMM) the high frequency bus for the DIMM 103 memory cell array which includes DRAMs 109 coupled to the Command and Address bus channel, with the command and address bus, Clock, and Data (DQ) signal path coupling the hub or buffer 104 (DQ bite 0) DRAMs, (DQ Byte 1-8) and the Spare (DQ Byte 9) devices 111 on the buffered DIMM memory cell array 103 which is connected to either the processor memory array controller 201 for microcontrols MC or another DIMM hub chip. As illustrated in FIG. 2 and FIG. 3, the dual mode DQ signal passes over the Data bus to the memory cell array via an I/O interface 202, and power-state register 203.

Due to the relatively high failure rate of DRAM devices and the reliability requirements of a high end server system the memory subsystem contain some number of spare DRAM devices 111 to allow the memory subsystem to self heal and avoid required down time to replace DIMMs for a failed memory device. More detail on this self healing spare device is shown in the application filed concurrently herewith, entitled "MEMORY SYSTEM HAVING SPARE MEMORY DEVICES ATTACHED TO A LOCAL INTERFACE BUS" filed concurrently hereby by inventors Warren Maule et all, and assigned to the assignee of this application, International Business Machines Corporation, which is fully incorporated herein by reference. One of the issues with adding spare devices 111 is that these extra devices consume power in the system even though they are not in use. Given that the memory subsystem is one of the largest power users in a system, this system reduces the power of the spare devices until they are needed for a repair action. In addition the system manages the power of the device that is being replaced so that the overall system power is not increased as spare devices are activated.

The memory subsystem illustrated by FIG. 3 includes the memory cell array which includes the local hub device 104 and memory device(s) 109. Any failing and/or replaced memory device(s) of the memory cell array 103 are placed in a low power state once they are/it is replaced (e.g. "mapped out") by a spare memory device. In accordance with our invention, which does not require separate control lines to each memory device. Memory device(s) of the memory cell array 103 include at least two new commands, with one placing the device in a low power state or low power-state programming mode and one returning the device to normal operation or normal mode from the low power state. The new commands include register write operations (in the normal mode READ/WRITE data and in the power-state programming mode a power-state code) completed using the data bus DQ signal such that each memory device can be uniquely accessed via their data lines (for multi-rank assemblies, the rank control signal may also be used to uniquely identify a memory device (e.g. DRAM6 with DQ Byte6) when multiple devices share the I/O data interface 202). Low power states control commands include commands for a standby state (where device retains data), a powered-off state, with no data retained for volatile devices, and a shut-down state where the device is effectively removed from the system and a new IPL sequence would be needed to reactivate it. These commands are supplied via the command bus to the power-state register 203.

Thus, instead of leaving a failing memory device in a operational state where a failing device (e.g. DRAM6 with DQ Byte6) continues to draw power, this inventions allows the failed device to be shut down to reduce the power draw in a system once the device fails.

This invention employs a method to eliminate the majority of the power associated with the spare device 111 until it is determined that the device is required in the system to replace a failing DRAM. This method does not require any unique signals from a memory hub. Instead, the method allows a spare DRAM to be placed in a low power state until needed and then places the failing DRAM into a low power state with the powered-off state command once it is mapped out of the rank by an appropriate command to the power-state register 203.

Given a DIMM design with multiple ranks of memory and multiple DRAMs per rank the memory hub has a large number of signals that need to be controlled to manage these DRAMs and ranks. When a spare DRAM is added to a rank of memory it needs to be controlled with a common set of signals as the rest of the DRAMs in that rank. For example the chip select, clock enable, address, etc signal need to be common as the DRAM need to behave properly when it is enabled as a replacement DRAM for a DRAM in that rank. Normally, individual DRAMs are not be placed in a low power state (though they can be) only the full rank, because separate copies of control signals for all DRAMs in a rank are not practicable due the increase in pin counts associated with the additional pins on the memory hub. While it is possible to envision designs that have separate signals for just the spare DRAMs, even this results in increased power for these spare signals and reduces the benefit of placing the spare in a low power state. Accordingly, we would not normally employ individual DRAMS being placed in a low power state in our preferred embodiment without the use of the new DRAM commands used to accomplish this task. These two commands are known as MR (write/read command) and MRS, a power-state programming command for the power-state register 203 control circuitry for the memory device.

This solution provided by the two new commands adds function which is internal to the DRAM device to allow an individual device to be placed into a low power state. Two new commands to the DRAM are required to accomplish this task, one to place the device in low power state and one to remove it from that state. To place a DRAM into the low power state a power-state register 203 mode register write command is added to the DRAM sequence to indicate to each DRAM that it needs to look at the input data bus to determine the outcome state of the device. To execute this MR Write command the memory controller or memory hub function control for the memory cell array 103 will follow the following steps:

a. all DRAMs in the addressed rank will be placed in a idle state, i.e. all ranks pre-charged and no activity on the data bus;

b. the encoded command that is to be sent to the individual DRAMs will be driven onto the data bus such that using the data bus instead of the address bus allows each individual DRAM in the rank to receive a different command vs a common command from the address bus;

c. once the data bus is in the correct state the MR Write command will be issued to the DRAM devices to instruct the DRAM to take the data on its data bus and place it in an internal power control register in the DRAM; and then d. the DRAM will decode the power control state that it received and it will take the necessary steps to place the device into the correct power state, at which point this individual DRAM device will remain in a programmed power state until it sees a command that overwrites the internal power control register and the DRAM will ignore all external command sequences other than one required to exit from the programmed power state.

To exit from the programmed power state the memory controller or memory hub will execute the following sequence.

e. the memory controller or hub will place all DRAMs in the rank into self timed refresh state;

f. the memory controller or hub will drive the data bus of each DRAM to the correct state for the desired power control level;

g. using proper DRAM device timing the memory controller will then issue a exit self timed refresh state command; and h. on the command cycle following the self timed refresh state command the memory controller will issue a MR Write command to update the internal power control register, wherein the DRAM will load the new data into the power control register decode the information and place the DRAM into the correct power state.

Note that this is different from standard exit self timed refresh state, a standard self timed refresh exit has a no-op command following the self timed refresh exit command. If a DRAM that is in a programmed power control state and it sees a standard self timed refresh exit command sequence it will ignore this sequence and return to its programmed power control state. This allows other DRAMs in the rank to enter and exit self timed refresh and not affect the power state of the DRAMs that are programmed into a power control state.

We have defined 4 states for the power-state register 203 for control and additional states may be added at a later time. The defined states are as follows:

state 0: normal operational state state 1: self timed refresh state-identical to the already defined self timed refresh state but entered and exited with the special command sequences defined above. This allows some DRAMs to be placed in a low power state and still maintain their data content for later inspection (for error cases) or later use while other DRAMs in the rank move in and out of self timed refresh state.

state 2: max power down state—In this state the DRAM is basically placed in a reset state. It will not maintain any data state in the device and will power gate all logic and get to the lowest power state possible. It still must be able to respond to the exit self time refresh state to allow the system to place it back in a normal operation state.

state 3: shut off state—in this state the DRAM will totally shut down and where possible power gates totally from the power rails. The device here should attempt to get to a 0 power state. In this state the device will no longer respond to the exit self timed refresh state and the only way for the system to regain control of the device would be a power cycle to reset the device to the IPL state.

This section further describes detailed DRAM implementation and several options for power state reprogramming after Self-Refresh referring to Figures.

FIG. 2 generally illustrates that this invention uses data signal (DQ) writing to distinguish spare DRAMs from normally operating DRAMs. If DRAM receives a power-state programming MRS command, it turns on its data input receivers and receives power-state coding through DQ pins, and then it stores the data not into the core but into an internal power-state register. The number of used DQ pins for the DQ data signal could be 2 as described above, or could be 1 or more than 2 depending on how many power-states it would have as defined in a protocol.

When the power-state programming MRS is issued, DQ data is provided to DRAM and the latency between the MRS command and the data has some predetermined value. The DQ may have a double data rate or single data rate, and the data may be captured by clock or strobe.

Figure 4:
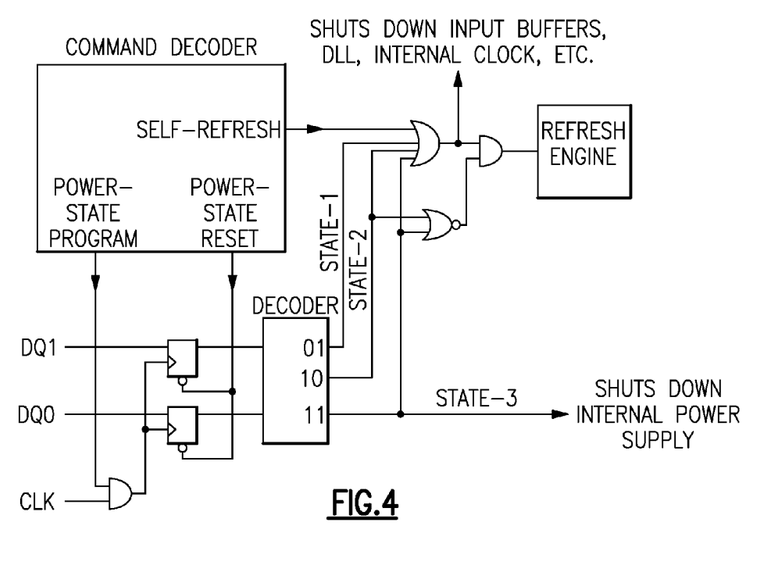
FIG. 4 illustrates a internal block diagram for controlling a DRAM's power supply.

FIG. 4 illustrates a internal block diagram for a DRAM power control. The command decoder provides 2 more signals than conventional case—power-state program and power-state reset signals. When the power-state programming MRS command is issued to the DRAM, the command decoder enables the power-state program signal so that data received by data input receivers would be stored into 2 flip flops. The flip flop outputs are decoded to generate power-state information. Only if the power-state is other than state-0 (normal state), all periphery circuits are shut down. If the power-state is state-2, then DRAM further enables a Self-Refresh engine. If the power-state is state-3, it shuts down an internal power supply so that internal power supply voltage would be grounded to block any leakage current.

Figure 5:
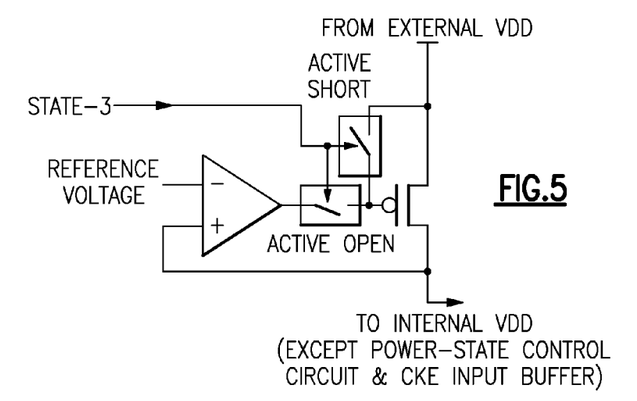
FIG. 5 shows how internal power supply shutting down is done.

FIG. 5 shows how this internal power supply shutting down is done. Usually there are one or more internal voltage regulators inside DRAM. If the power-state is state-3, the PFET transistor is fully turned off to disconnect any path between external power supply and internal VDD node. The internal VDD voltage would go to the ground due to leakage current. There could be the third switch to tie the internal VDD to the ground in another embodiment.

Figure 6:
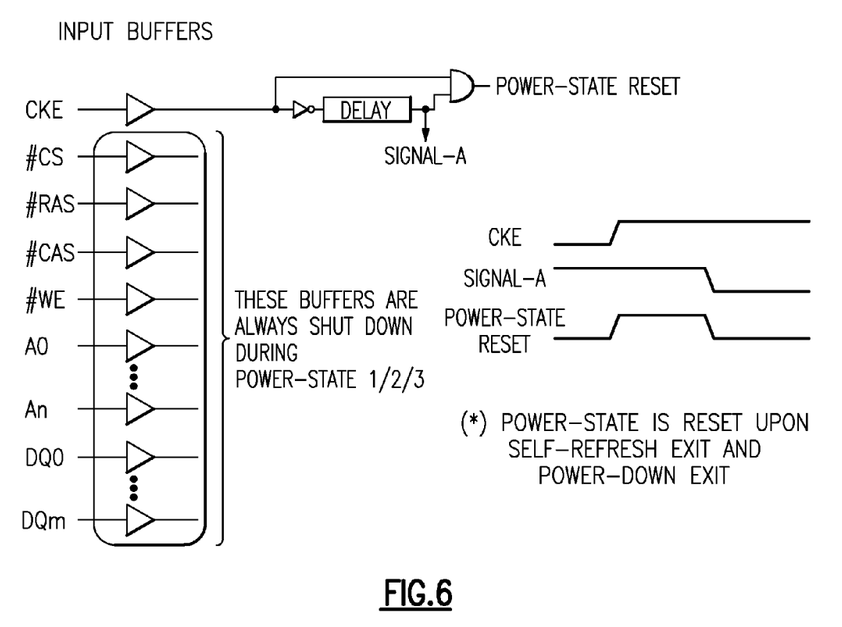
FIG. 6 shows how to wake up those DRAMs that are locked into one of power saving states (state-1/2/3) when there is a need to change spare DRAMs.

FIG. 6 shows how to wake up those DRAMs that are locked into one of power saving states (state-1/2/3) when there is a need to change spare DRAMs. Because those DRAMs in state-1/2/3 should consume minimum power, it is desirable that all command/address input receivers should be shut down. In this case, those DRAM cannot understand any command, so a special protocol is needed for those DRAMs to detect power-state reset inquiry from micro control MC. There is at least one input buffer to detect the power-state reset request. So, CKE input buffer will be turned on as it is in conventional DRAM regardless of the power mode—i.e., it is on even during Self-Refresh mode in conventional DRAM or a DRAM in state-0 of this invention. Therefore, by detecting CKE's L→H transition, a DRAM can reset its internal power-state to state-0 so that it can respond to external commands. And then, MC can reprogram all DRAMs by using the protocol described in FIG. 1. When there is no need to replace or redefine spare DRAMs, MC has only to program DRAMs exactly same to the previous state.

However, CKE L→H occurs for not only Self-Refresh exit but also Power-down exit, MC may need to do the power-state reprogramming procedure too often if the system uses power-down modes frequently. If there is some way to distinguish normal CKE transition and special CKE transition for power-state reset, it would reduce the system timing overhead.

Figure 7:
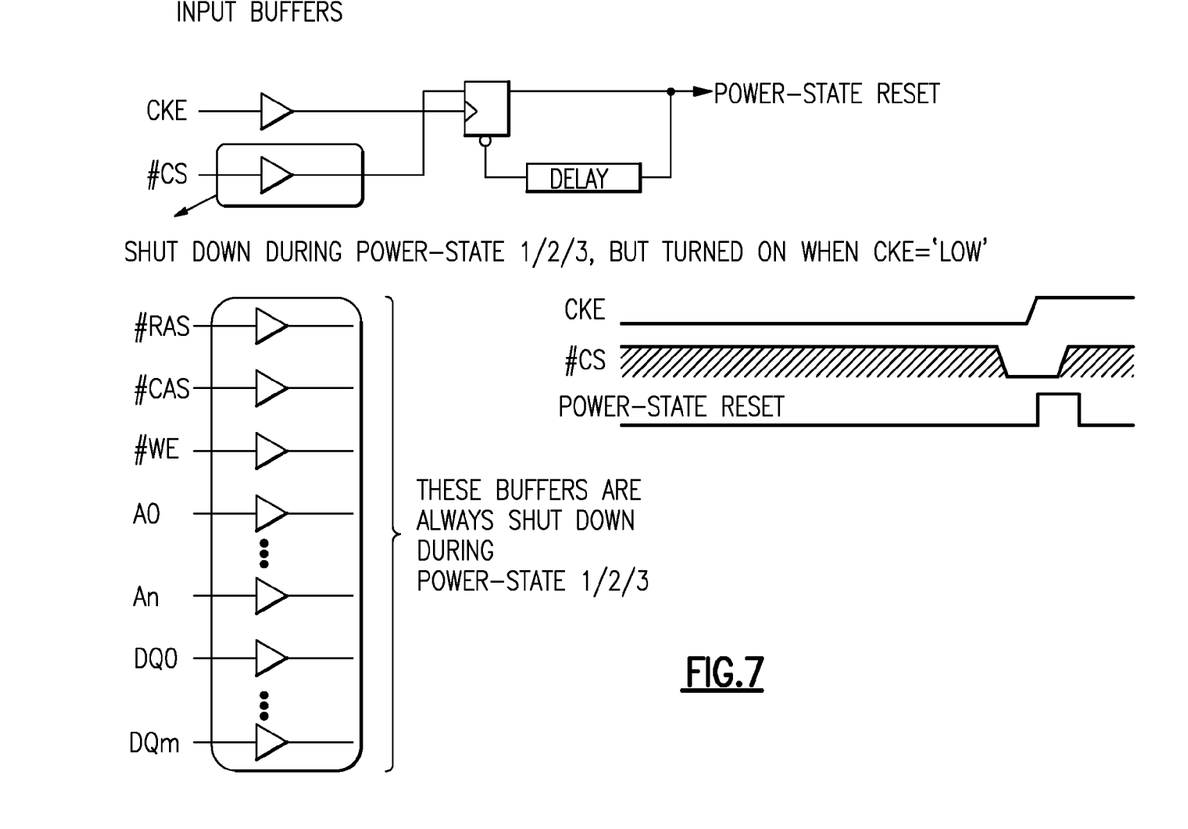
FIG. 7 shows alternative way to detect power-state reset.

FIG. 7 shows alternative way to detect power-state reset. To distinguish normal CKE transition and special CKE transition, it should turn on another input buffer-#CS input buffer. Depending on the state of #CS pin at CKE L→H transition edge, DRAM can know whether it is normal power-down exit or power-state reset request. However, turning on 2 input buffers instead of only one would mean additional power for spare DRAMs. One way to minimize the spare DRAM power for this option is to turn on the #CS input buffer only when CKE pin is 'L'.

One more thing for this option is that DRAM command should be NOP (no-operation) or DES (deselect) for CKE L→H transition. In conventional DRAM, it is users choice which one to use between NOP and DES. In this invention, either one of NOP or DES should be always used for normal CKE L→H transition (SR exit or PD exit) and the other one should be dedicated to indicated special CKE L→H transition (SR or PD exit+power-state reset). FIG. 6 shows an example where NOP (#CS='L') would mean the special CKE transition.

Figure 8:
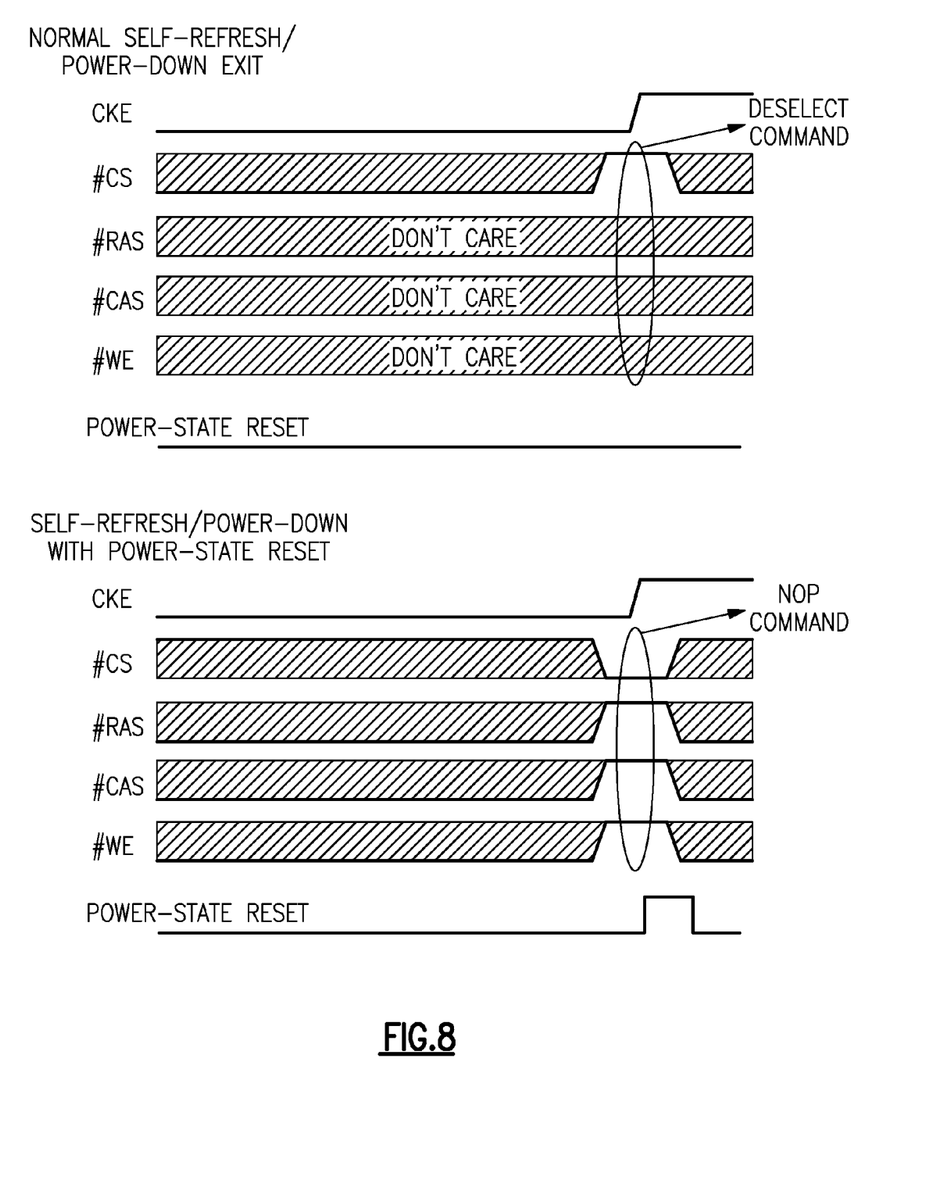
FIG. 8 shows another way of DRAM implementation.
Figure 9:
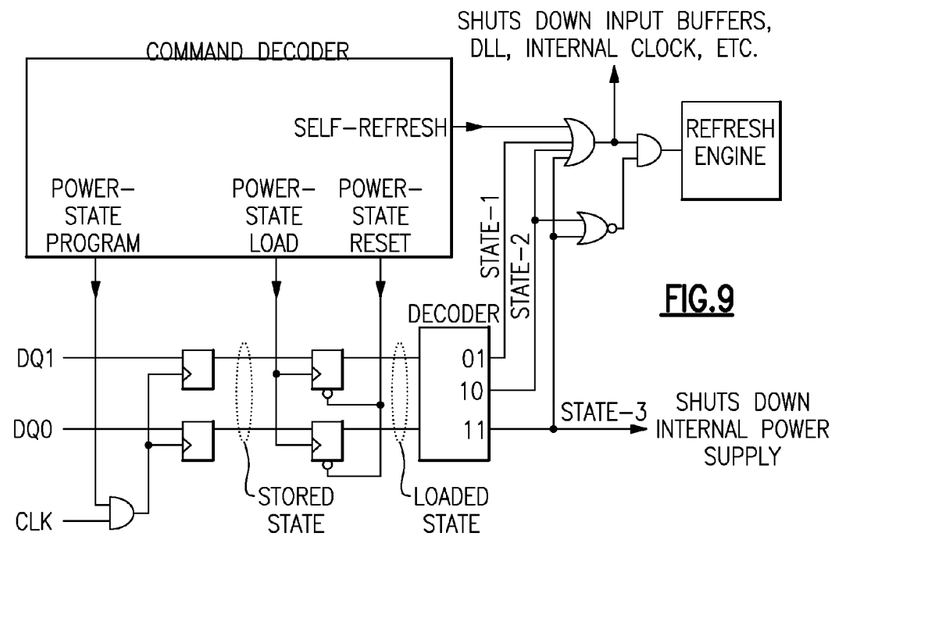
FIGS. 9 through 12 show comparisons among option-1, 2 and 3.
Figure 10:
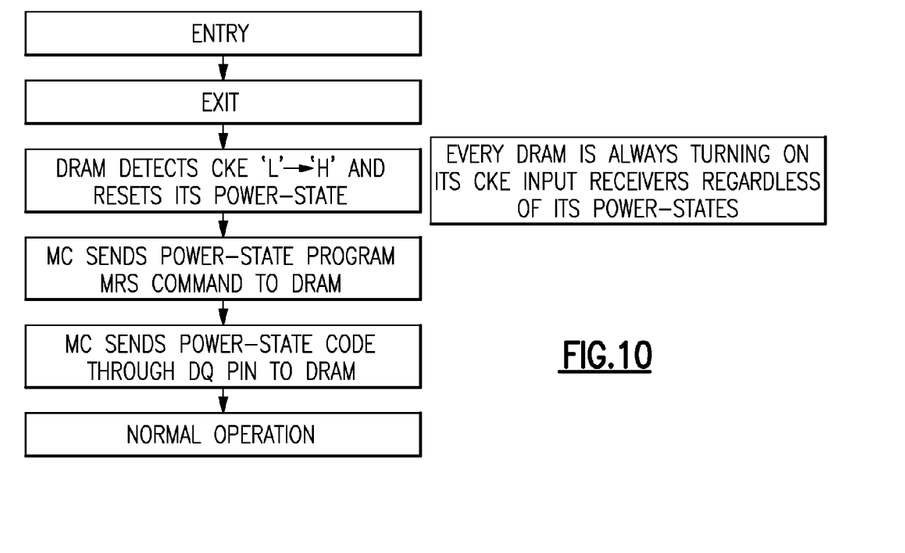

FIG. 8 shows another way of DRAM implementation. Instead of having two power-state control commands as described above (power-state program command [MRS] and power-state reset command [CKE L→H transition]), it has one more command—power-state load command [MRS]. In this case, even when the power-state is RESET, MC does not need to reprogram all DRAMs by writing to DQ, and it has only to "retrieve" the power-state from previously stored state values. In this case, when it is not needed to change power-state of any DRAM or reconfigure spare DRAMs, MC has only to send a single MRS command to put spare DRAMs into power-saving states without need to execute relatively complex and time consuming procedure that was described in FIG. 2. This option is described as option-3 in following explanation.

FIGS. 9 through 12 show comparison among option-1, 2 and 3. In option-1 shown in FIG. 10 has minimum number (one) of input buffers turned on for spare DRAM, but need to execute reprogramming of power-state at every power-down or self-refresh exit. (maximum timing overhead)

Figure 11:
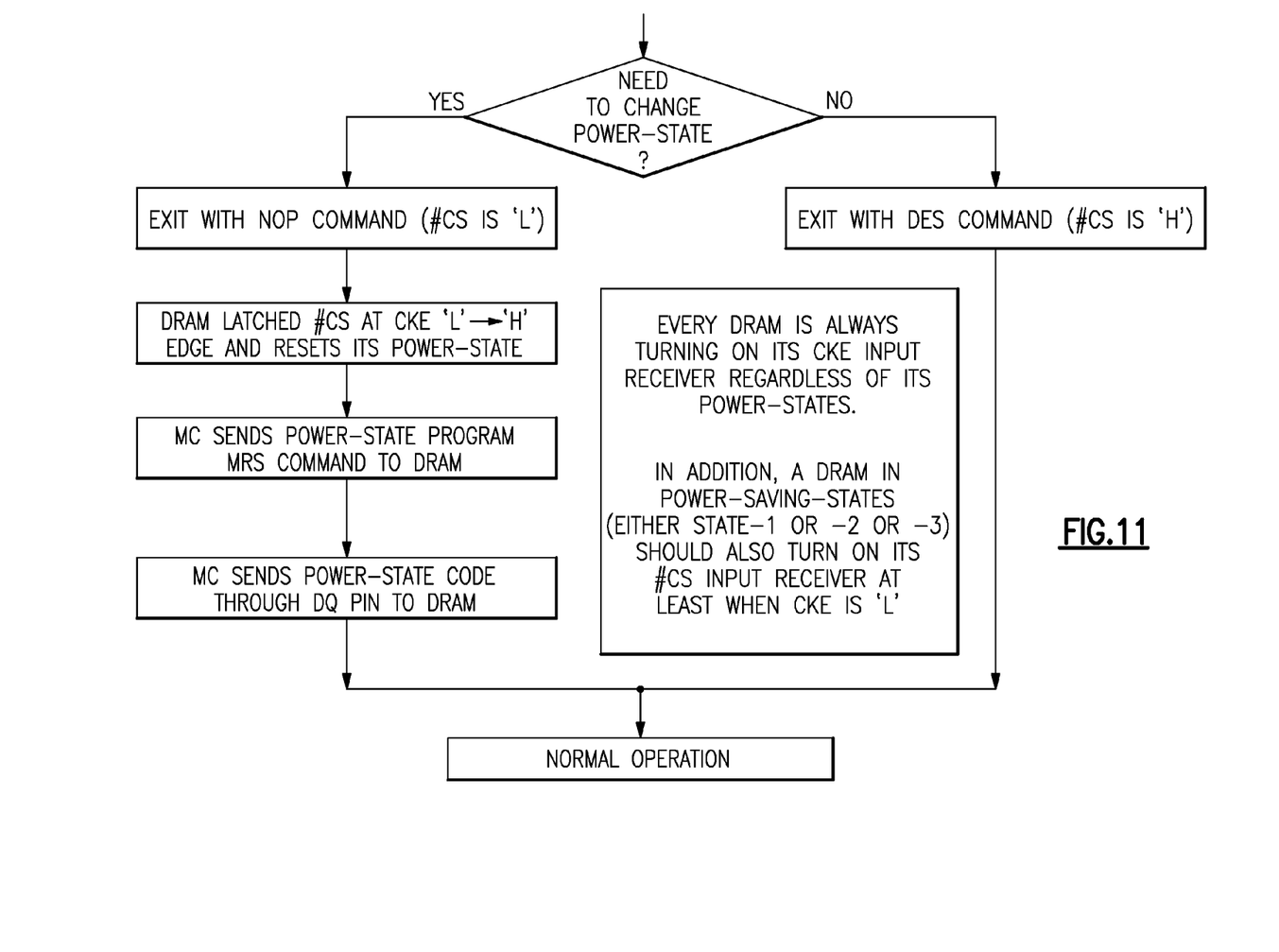

In option-2 shown in FIG. 11 has minimum timing overhead for normal power-down or self-refresh exit, but 2 input buffers should be turned on at least during CKE='L' (power-down or self-refresh).

Figure 12:
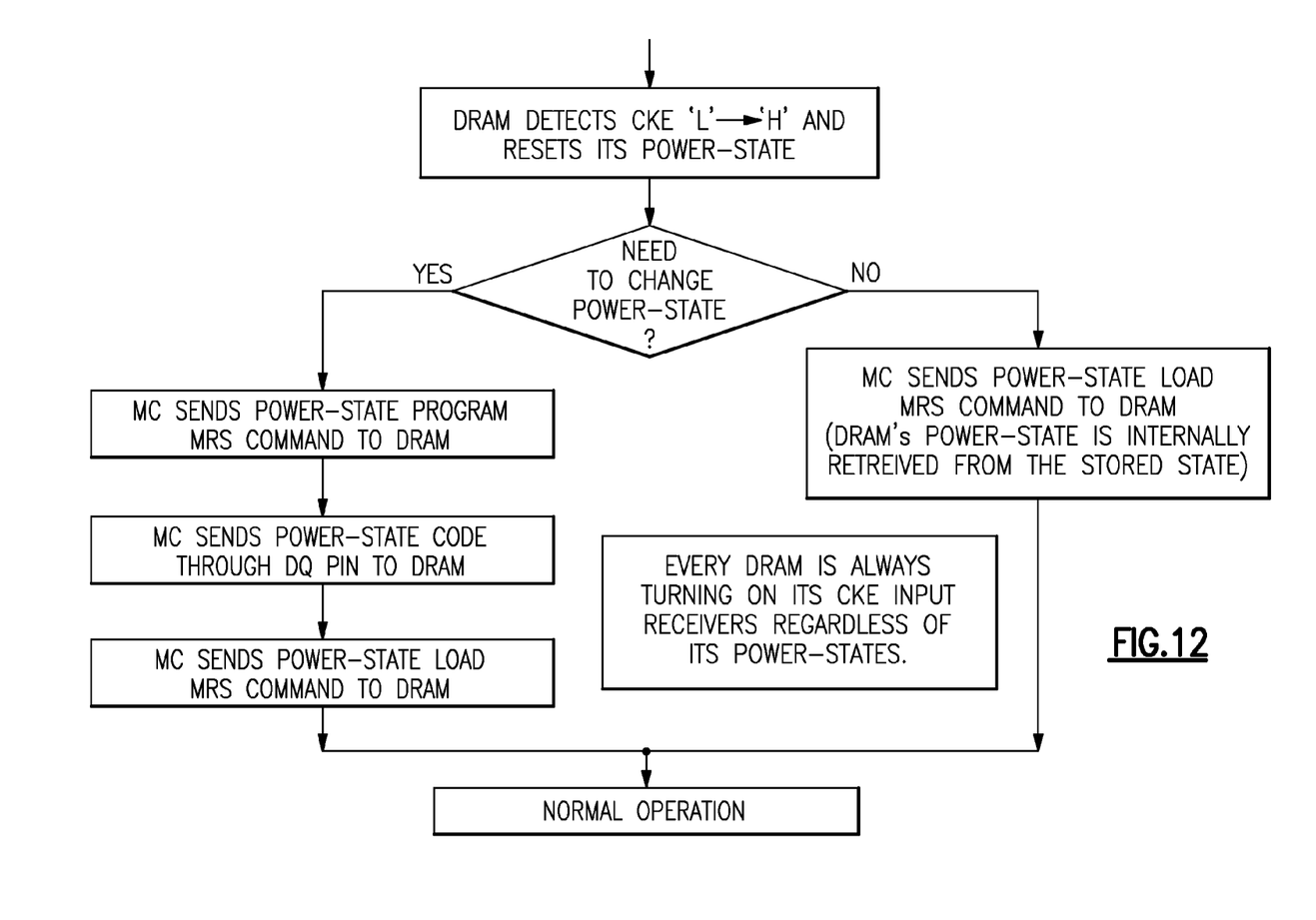

In option-3 shown in FIG. 12 has the same minimum spare DRAM power, and medium timing overhead.

Figure 13:
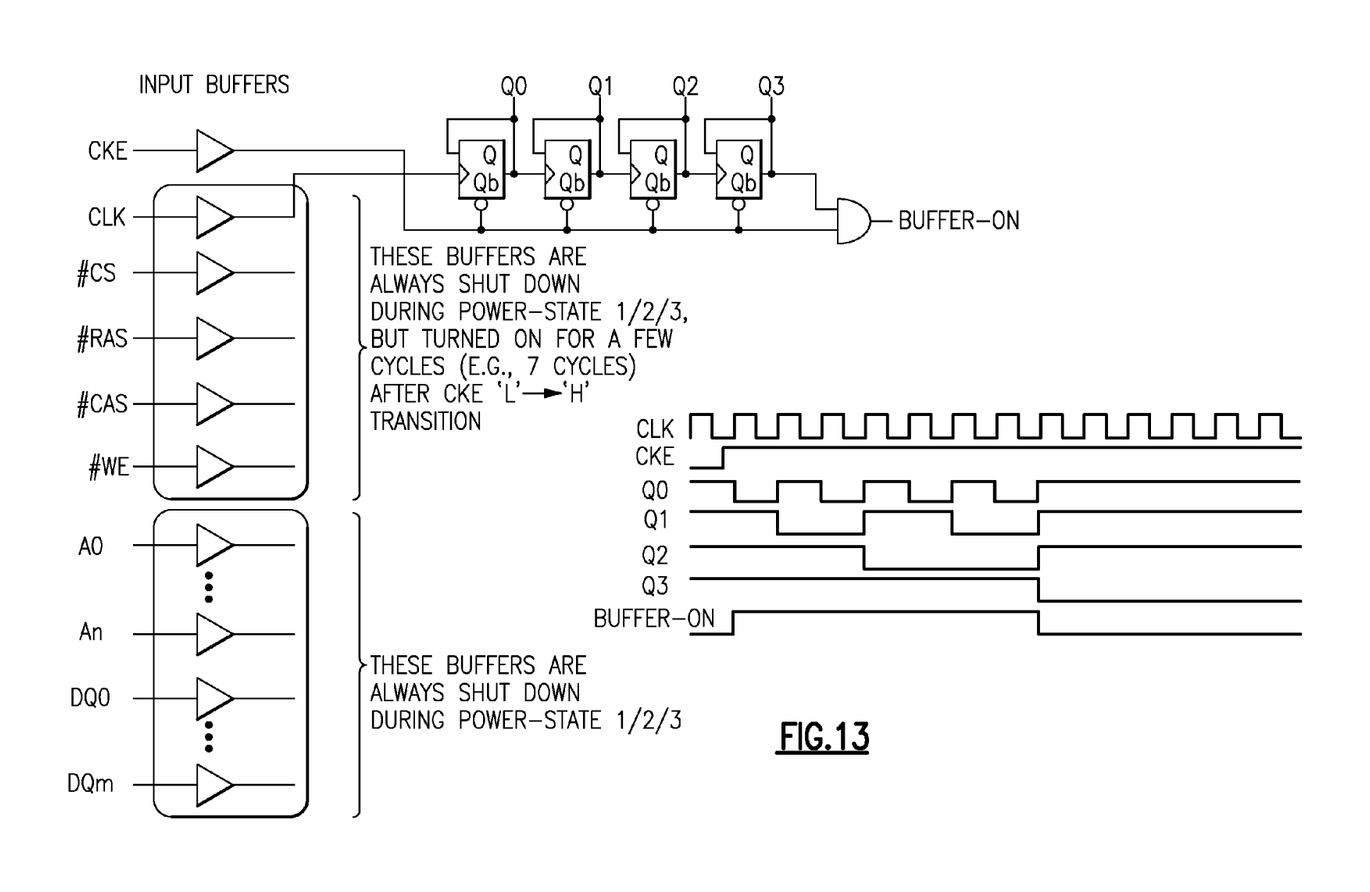
FIG. 13 and FIG. 14 show another option (option-4).
Figure 14:
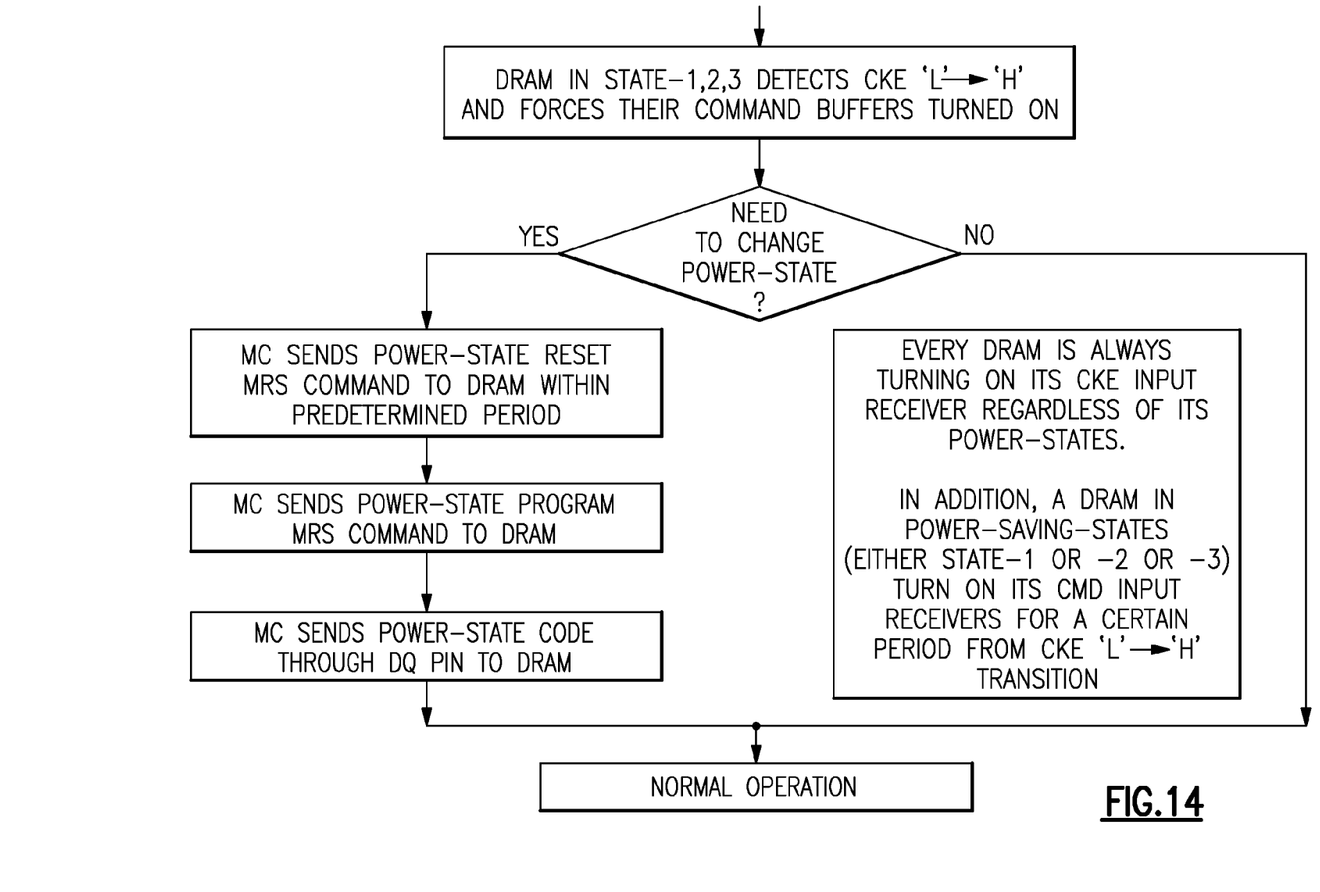

FIG. 13 and FIG. 14 show another option (option-4). In this option, DRAM does not use CKE L→H transition to reset its power-state, but the power-state reset command is one of normal command (for example, #CS/#RAS/#CAS/#WE='LHHL'). However, this requires that a spared DRAM should be able to receive these command signals. For this purpose, those input buffers are turned on at CKE L→H transition and during a predetermined time period (i.e., 8 or 16 cycles). MC needs to issue the power-state reset command during that time period if it wants to do so. This option minimizes the timing overhead for power-state reprogramming because it does not need to do anything if power-states are not to be changed. FIG. 13 shows an example of the case that DRAM would turn its command input buffers for 7 cycles using a counter. FIG. 14 shows the corresponding procedure of the option-4 compared to other options shown in FIG. 10 through 12.

Aspects of the present invention can be implemented in software, firmware, hardware or some combination thereof.

As one example, one or more aspects of the present invention can be included in an article of manufacture (e.g., one or more computer program products) having, for instance, computer usable media or e-PROM. The media has embodied therein, for instance, computer readable program code means for providing and facilitating the capabilities of the present invention. The article of manufacture can be included as a part of a computer system or sold separately.

Additionally, at least one program storage device, such as an embedded e-prom, readable by a machine, tangibly embodying at least one program of instructions executable by the machine to perform the capabilities of the present invention can be provided.

There may be many variations to these examples or the steps (or operations) described therein without departing from the spirit of the invention. For instance, some of the steps may be performed in a differing order, or steps may be added, deleted or modified unless specified as sequential. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A computer memory comprising:
a DIMM (Dual Inline Memory Module)
a plurality of DRAM (Dynamic Random Access Memory) chips mounted on the DIMM, the plurality of DRAM chips comprising a rank of memory including a spare DRAM in the rank of memory, each of the plurality of DRAM chips configured to be powered up or placed into a low power state via commands sent on one or more data signals (DQ signals) unique to the each of the plurality of DRAM chips comprising the rank of memory;
each of the plurality of DRAM chips mounted on the DIMM comprises a command decoder to control clocking of signals on the one or more DQ signals, and a decoder to decode the DQ signals when clocked to the decoder, a first decoder output to place the DRAM in a low power state and a second decoder output to place the DRAM in a powered up state; and
wherein the spare DRAM is placed in the low power state until a particular chip in the rank of memory fails, upon which the spare DRAM is placed in the powered up state and the particular chip in the rank of memory that failed is placed into the low power state.

* * * * *